(12) United States Patent
Hatade et al.

(10) Patent No.: US 6,388,280 B2
(45) Date of Patent: May 14, 2002

(54) SEMICONDUCTOR DEVICE

(75) Inventors: Kazunari Hatade, Tokyo; Kazutoyo Takano, Hyogo, both of (JP)

(73) Assignees: Mitsubishi Denki Kabushiki Kaisha, Tokyo; Ryoden Semiconductor System Engineering Corporation, Itami, both of (JP)

( * ) Notice: Subject to any disclaimer, the term of this patent is extended or adjusted under 35 U.S.C. 154(b) by 0 days.

(21) Appl. No.: 09/835,379

(22) Filed: Apr. 17, 2001

(30) Foreign Application Priority Data

Jun. 7, 2000 (JP) .......................... 2000-169881

(51) Int. Cl.$^7$ .............................. H01L 29/80
(52) U.S. Cl. .................. 257/262; 257/335; 438/197
(58) Field of Search ................. 257/262, 213, 257/342, 212, 273, 335, 401, 495, 143, 135, 339, 341, 343, 327

(56) References Cited

U.S. PATENT DOCUMENTS

| | | |
|---|---|---|
| 4,376,286 A | 3/1983 | Lidow et al. |
| 4,593,302 A | 6/1986 | Lidow et al. |
| 4,680,853 A | 7/1987 | Lidow et al. |
| 6,207,993 B1 | 3/2001 | Ishimura et al. |

*Primary Examiner*—David Nelms
*Assistant Examiner*—Andy Huynh
(74) *Attorney, Agent, or Firm*—Oblon, Spivak, McClelland, Maier & Neustadt, P.C.

(57) ABSTRACT

The object of the invention is to improve a characteristic under a reverse bias. A P base layer (6) is provided as a plurality of band-shaped portions parallel with each other. A P$^+$ base layer to be a downward protrusion having a high impurity concentration is not formed in a bottom portion of the P base layer (6). The P base layer (6) is formed more shallowly than an N layer (17), and furthermore, the band-shaped portions forming the P base layer (6) are coupled to each other at ends thereof. Moreover, an N source layer (5) is ladder-shaped and is connected to a source electrode (16) through only a crosspiece portion thereof.

12 Claims, 8 Drawing Sheets

SEMICONDUCTOR DEVICE

BACKGROUND OF THE INVENTION

1. Field of the Invention

The present invention relates to an insulated gate semiconductor device represented by a MOSFET, an IGBT and the like, and more particularly to an improvement of a reverse bias characteristic thereof.

2. Description of the Background Art

Figure 8:
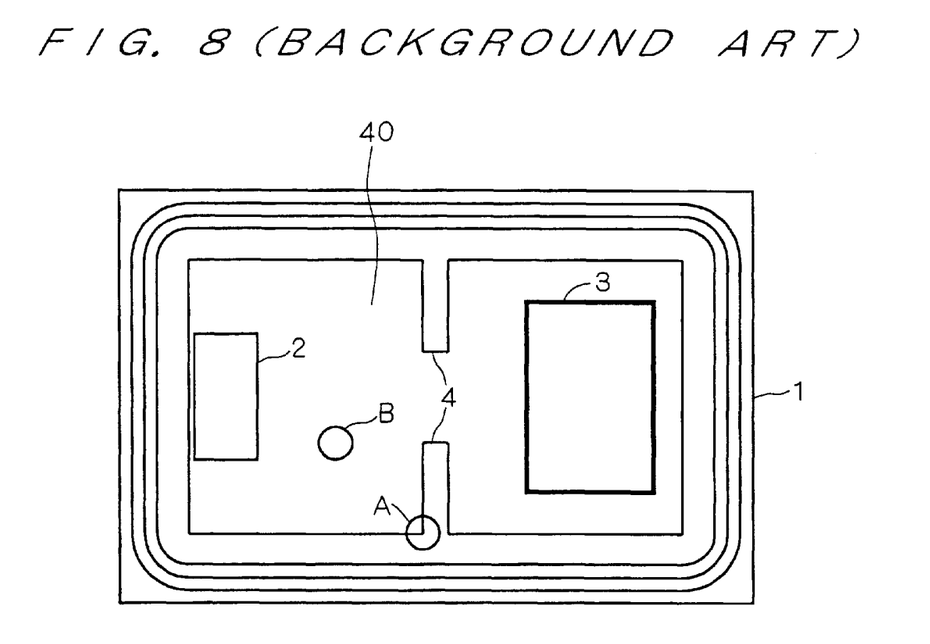
FIG. 8 is a plan view which is common to the device according to the embodiment and a conventional device.

In recent years, attention has been given to a MOSFET or an IGBT as a switching element to be used for inverter control or the like. FIG. 8 is a plan view showing a typical MOSFET. The MOSFET is a so-called vertical type MOSFET in which a gate wire bonding pad 2 and a source wire bonding pad 3 are provided on an upper main surface of a semiconductor substrate 1. A large number of unit cells are arranged along a main surface of the semiconductor substrate 1. Each of the unit cells functions as a single MOSFET. A region 40 where the unit cells are to be arranged is referred to as a cell region and a partial region B represents the cell region 40. Moreover, a gate wiring region 4 is formed around the cell region 40 and a partial region A represents a boundary portion between the cell region 40 and the gate wiring region 4.

Figure 9:
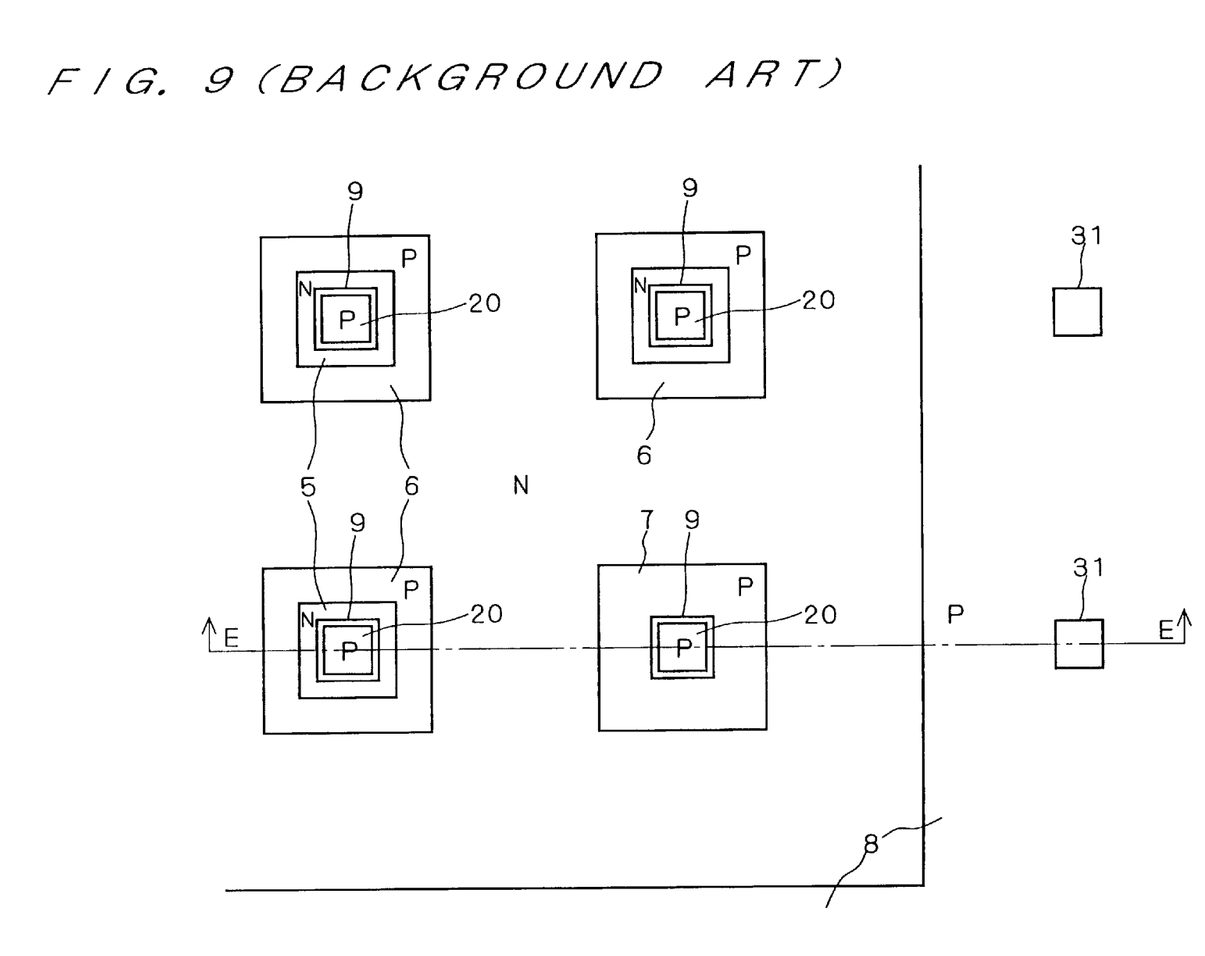
FIG. 9 is a partially enlarged plan view showing the region A of FIG. 8 in the conventional device.
Figure 10:
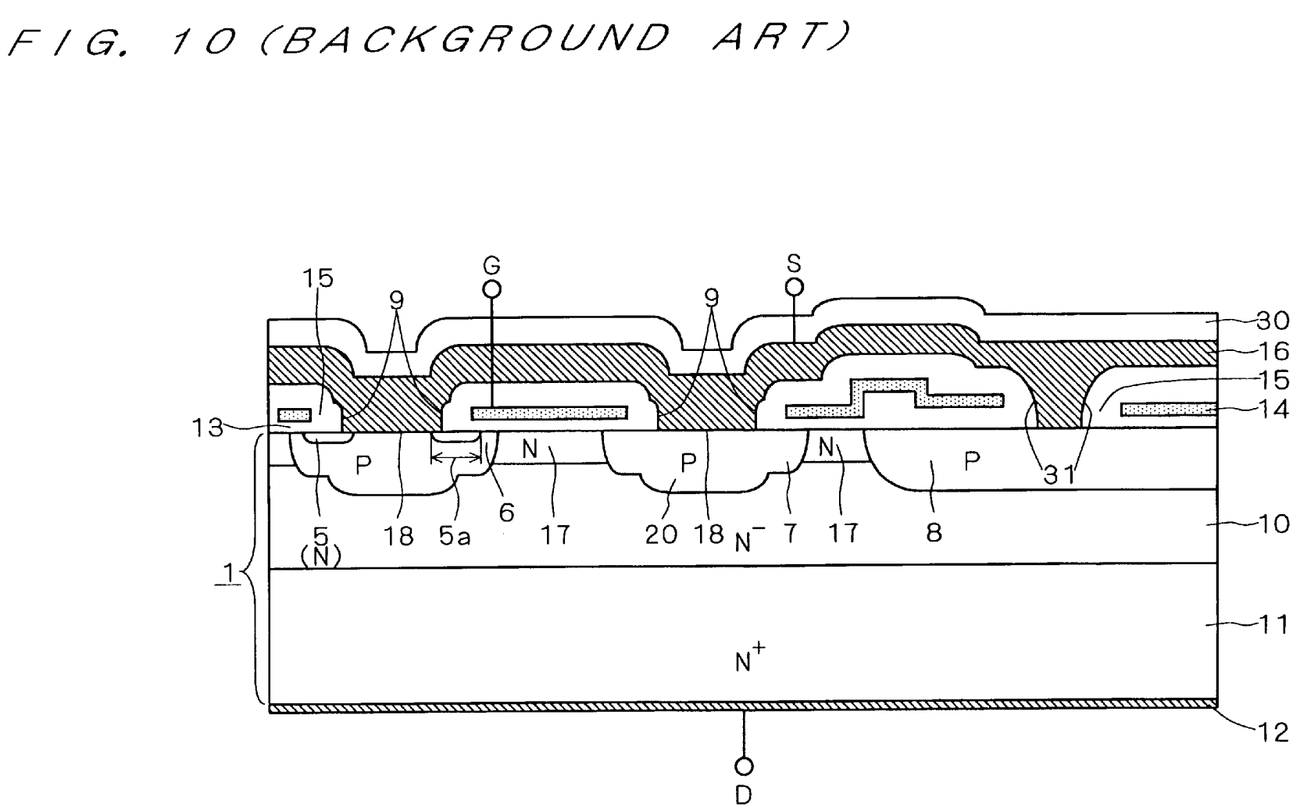
FIG. 10 is a sectional view taken along a line E—E in FIG. 9.

FIG. 9 is an enlarged plan view showing patterns of various semiconductor layers exposed to the upper main surface of the semiconductor substrate 1 in the region A of FIG. 8. Moreover, FIG. 10 is a sectional view taken along a cutting line E—E in FIG. 9. The semiconductor substrate 1 comprises an $N^+$ layer 11 exposed to a lower main surface, an $N^-$ layer 10 formed on the $N^+$ layer 11, an N layer 17 having a low resistance which is formed on the N layer 10 and is exposed to the upper main surface, P base layers 6, 7 and 8 selectively formed in the upper main surface, a $P^+$ base layer 20 having a low resistance which is protruded downward in central parts of bottom portions of the P base layers 6 and 7, and an N source layer 5 selectively formed in the upper main surface more shallowly than the P base layer 6 on the inside thereof. The N layer 17 is formed more shallowly than the P base layers 6, 7 and 8.

The P base layers 6 and 7 have polygonal (square in the example of FIG. 9) planar shapes and are isolated from each other and arranged in a matrix. Moreover, the P base layers 6 and 7 are also isolated from the P base region 8 formed under the gate wiring region 4.

The N source layer 5 formed in the P base layer 6 has an annular planar shape and forms the same polygon (square in the example of FIG. 9) as the P base layer 6. An annular portion of the P base layer 6 positioned on the outside of the annular N source layer 5 functions as a channel region. On the other hand, the N source layer 5 is not formed in the P base layers 7 and 8. Accordingly, the P base layers 7 and 8 do not have the channel region. The P base layer 7 is selectively formed in the vicinity of the P base layer 8.

An insulating layer 15 is formed on the upper main surface of the semiconductor substrate 1, and a source electrode 16 is formed on the insulating layer 15. The source electrode 16 is covered with another insulating layer 30. The P base layers 6 and 7 are connected to the source electrode 16 through an opening 9 selectively formed on the insulating layer 15. The source electrode 16 is also connected to the P base region 8 through an opening 31 selectively formed on the insulating layer 15. More specifically, the P base layers 6, 7 and 8 isolated from each other in the semiconductor substrate 1 are connected to each other through only the source electrode 16.

A gate electrode 14 is buried in the insulating layer 15 and is opposed to the upper main surface of the semiconductor substrate 1 with a gate insulating film 13, which is a part of the insulating layer 15, interposed therebetween. The gate electrode 14 is opposed to the channel region of the P base layer 6 and is also opposed to an exposed surface of the N layer 17 (the exposed surface also implies a portion exposed to the upper main surface of the semiconductor substrate 1). Furthermore, the gate electrode 14 is opposed to a part of an exposed surface of the P base layer 7 and the almost whole region of an exposed surface of the P base region 8. A portion in the gate electrode 14 which is opposed to the almost whole region of the exposed surface of the P base region 8 functions as a gate wiring.

A drain electrode 12 is connected to the lower main surface of the semiconductor substrate 1. As shown in FIG. 10, the $N^+$ layer 11 is exposed to the lower main surface in the MOSFET. Therefore, the drain electrode 12 is directly connected to the $N^+$ layer 11.

In the MOSFET having the above-mentioned structure, when a gate voltage which is equal to or higher than a threshold voltage is applied to the gate electrode 14 in a state in which a positive voltage is applied to the drain electrode 12 based on the source electrode 16, an inversion layer is formed in the exposed surface of the P base region 6 positioned under the gate electrode 14, that is, the channel region and a current flows through the inversion layer. In other words, the MOSFET is turned ON.

If the gate voltage to be applied to the gate electrode 14 is less than a threshold, the inversion layer is annihilated. Therefore, the MOSFET is brought into an OFF state. At this time, a drain voltage is held by a depletion layer extended from a PN junction between each of the P base layers 6, 7 and 8 and the $N^-$ layer 10 in a reverse bias state toward the inside of the $N^-$ layer 10.

When a positive voltage is applied to the source electrode 16 based on the drain electrode 12 in a state in which the source electrode 16 and the gate electrode 14 are short-circuited from each other, holes are injected from each of the P base regions 6, 7 and 8 connected to the source electrode 16 into the $N^-$ layer 10 and an electrons are injected from the $N^+$ layer 11 joined with the drain region 12 to the $N^-$ layer 10. Since the PN junction between each of the P base regions 6, 7 and 8 and the $N^-$ layer 10 functions as a diode, a current flows from the source electrode 16 to the drain electrode 12.

When a negative voltage is applied to the source electrode 16 based on the drain electrode 12 in this state, that is, a source-drain voltage is inverted into a reverse bias, the holes remaining in the $N^-$ layer 10 moves to the source electrode 16 and the electrons remaining in the $N^-$ layer 10 moves to the drain electrode 12. As a result, a current flows from the drain electrode 12 to the source electrode 16. A mobility of the hole is half of that of the electron. Therefore, a time required for attenuating the current to zero is equal to a time required for annihilating the holes remaining in the $N^-$ layer 10. An operation of the MOSFET which is carried out under the reverse voltage is exactly equivalent to a recovery operation of a diode provided in the MOSFET.

A switching loss generated by a switching operation of the MOSFET greatly depends on a feedback capacitance, which is a parasitic capacitance of the MOSFET. The feedback capacitance is generated between the gate electrode 14 and the N layer 17 opposed thereto and greatly depends on an area of the exposed surface of the N layer 17. In the conventional MOSFET, the P base layer 6 belonging to each cell is arranged in a matrix. As a result, there has been a problem in that an occupation ratio of the exposed surface of the N layer 17 is higher than that of the exposed surface of the P base layer 6 in the upper main surface of the semiconductor substrate 1 and the feedback capacitance is large.

Moreover, the P base layers 6 and 7 of the conventional MOSFET have polygonal planar shapes. Therefore, a distance between the P base layers 6 and 7 adjacent to each other in a direction of the matrix (in a vertical or transverse direction of FIG. 9) is different from a distance between the P base layers 6 and 7 adjacent to each other in an oblique direction. Furthermore, a corner portion is formed in the planar shapes of the P base layers 6 and 7 in a direction in which they are obliquely adjacent to other P base layers 6 and 7. The corner portion has a large curvature. For this reason, when the source-drain voltage is changed into a reverse bias, the depletion layer is extended nonuniformly from the PN junction between each of the P base regions 6, 7 and 8 and the N⁻ layer 10 toward the inside of the N⁻ layer 10 and a critical field strength is reached at a comparatively low source-drain voltage in the corner portion so that an avalanche breakdown is caused.

Furthermore, when the conventional MOSFET carries out a switching operation under an inductive load, counter electromotive force is generated during turn-off so that the avalanche breakdown is caused and an avalanche current flows in some cases. The avalanche current converges on the corner portions of the P base layers 6 and 7 where the critical field strength is reached at a comparatively low source-drain voltage. Therefore, there has been a problem in that a parasitic bipolar transistor formed by the N⁻ layer 10, the P base layer 6 and the N source layer 5 is turned ON with a comparatively low avalanche current.

In the conventional MOSFET, moreover, the P⁺ base layer 20 is formed in the P base regions 6 and 7 and is protruded downward in the central parts of the bottom portions. The P⁺ base layer 20 has a larger depth and a larger curvature than the P base layers 6 and 7. Since the P⁺ base layer 20 is deeper than the P base layers 6 and 7, when the source-drain voltage is changed into the reverse bias, an effective distance of the depletion layer capable of being extended from the PN junction between the P⁺ base layer 20 and the N⁻ layer 10 toward the inside of the N⁻ layer 10 is shortened in the N⁻layer 10. Furthermore, since the P⁺ base layer 20 has a large curvature, there has been a problem in that a portion where the critical field strength is reached at a comparatively low source-drain voltage is generated, resulting in an avalanche breakdown.

In the conventional MOSFET, furthermore, the N layer 17 having a low resistance is formed under the gate electrode 14 more shallowly than the P base layer 6. When the MOSFET is turned ON, the N layer 17 having a low resistance functions to reduce a junction resistance in the PN junction between the P base layer 6 and the N⁻ layer 10. However, since the N layer 17 is shallower than the P base layer 6, there has been a problem in that the junction resistance is not sufficiently reduced.

In the conventional MOSFET, moreover, the P base layers 6, 7 and 8 are isolated from each other in the semiconductor substrate 1 and are connected to each other through only the source electrode 16. As described above, the PN junction between each of the P base layers 6, 7 and 8 and the N⁻ layer 10 corresponds to the diode provided in the MOSFET. Holes generated with the conduction of the internal diode depends on areas of the exposed surfaces of the P base layers 6, 7 and 8 and a concentration of a P-type impurity contained therein. Therefore, the largest number of holes are generated in the vicinity of the P base layer 8. In the case in which the internal diode is caused to carry out a recovery operation at comparatively high di/dt (i.e., a rate of current change), the holes remaining in the vicinity of the P base layer 8 intensively flows into the P base layer 6 positioned in the vicinity of the P base layer 8, and furthermore, passes through a contact portion 18 between the P base layer 6 and the source electrode 16 toward the source electrode 16. During this process, a parasitic bipolar transistor formed by the N⁻layer 10, the P base layer 6 and the N source region 5 is problematically conducted.

As shown in FIG. 9, the P base layer 7 in which the N source region 5 is not formed is provided in the vicinity of the P base layer 8 such that the parasitic bipolar transistor is not formed in the vicinity of the P base layer 8. However, when the di/dt is increased to a certain extent, the holes remaining in the vicinity of the P base layer 8 intensively flows into not only the closest P base layer 7 but also the P base layer 6 provided in the vicinity thereof. Consequently, the holes pass through the contact portion 18 toward the source electrode 16. As a result, there has been a problem in that the parasitic bipolar transistor is conducted in the P base layer 6 positioned in the vicinity of the P base layer 7. Furthermore, if a large number of P base layers 7 in which the N source layer 5 is not formed are provided to obtain a high di/dt tolerance, the number of cells to be turned ON when the MOSFET is turned ON is decreased; i.e., a channel width of the whole MOSFET is problematically reduced and therefore an ON-state resistance is increased.

SUMMARY OF THE INVENTION

In order to solve the above-mentioned problems in the conventional device, it is an object of the present invention to provide a semiconductor device capable of improving a characteristic under a reverse bias.

A first aspect of the present invention is directed to a semiconductor device comprising a semiconductor substrate having an upper main surface and a lower main surface, the semiconductor substrate including a first semiconductor layer of a first conductivity type, a second semiconductor layer of the first conductivity type which is formed on the first semiconductor layer to be exposed to the upper main surface and has a higher impurity concentration than the first semiconductor layer, a third semiconductor layer of a second conductivity type which is selectively formed in the upper main surface more shallowly than the second semiconductor layer, is divided into and provided as a plurality of band-shaped portions parallel with each other, and is not provided with a downward protrusion having a higher impurity concentration in a bottom portion than a periphery, a fourth semiconductor layer of the first conductivity type which is selectively formed in the upper main surface and is divided into and provided as a plurality of ladder-shaped portions parallel with each other, each of the ladder-shaped portions being formed to be extended more shallowly in and along any of at least a part of the band-shaped portions individually corresponding thereto, and a fifth semiconductor layer of the second conductivity type which is selectively formed in the upper main surface and couples the band-shaped portions to each other, the semiconductor device further comprising an insulating film formed on a region interposed between adjacent sets of the ladder-shaped portions in the upper main surface, a gate electrode formed on the insulating film and opposed to the region, a first main electrode connected to each of the band-shaped portions and connected to each of the ladder-shaped portions through at least a crosspiece portion thereof, and a second main electrode connected to the lower main surface.

A second aspect of the present invention is directed to the semiconductor device according to the first aspect of the present invention, wherein the first main electrode is connected to each of the ladder-shaped portions through only the crosspiece portion thereof.

A third aspect of the present invention is directed to the semiconductor device according to the first or second aspect of the present invention, wherein the fifth semiconductor layer is formed to surround a region where the band-shaped portions are arranged, and couples the band-shaped portions to each other on ends in a direction of extension of the band-shaped portions.

A fourth aspect of the present invention is directed to the semiconductor device according to any of the first to third aspects of the present invention, wherein at least one of the band-shaped portions does not include any of the ladder-shaped portions on ends in a direction of arrangement thereof.

A fifth aspect of the present invention is directed to the semiconductor device according to the fourth aspect of the present invention, further comprising a sixth semiconductor layer of the first conductivity type which is selectively formed like a comb tooth in the upper main surface and is extended more shallowly within and along one of the at least one band-shaped portion provided most apart from the end in the direction of arrangement of the at least one band-shaped portion such that the comb tooth faces to the end side, the insulating film being also formed on an end region which is a region interposed between the sixth semiconductor layer and one of the ladder-shaped portions adjacent thereto in the upper main surface, the gate electrode being also formed on a portion of the insulating film provided on the end region and being thereby opposed to the end region, and the first main electrode being also connected to the sixth semiconductor layer through at least the tooth.

A sixth aspect of the present invention is directed to the semiconductor device according to the fifth aspect of the present invention, wherein the first main electrode is connected to the sixth semiconductor layer through only the tooth.

A seventh aspect of the present invention is directed to the semiconductor device according to any of the first to sixth aspects of the present invention, wherein the second semiconductor layer is selectively formed shallowly directly under the third semiconductor layer.

An eighth aspect of the present invention is directed to the semiconductor device according to any of the first to seventh aspects of the present invention, wherein a first boundary portion provided along an outside of each of the ladder-shaped portions is shorter than a second boundary portion provided along an inside in a boundary exposed to the upper main surface between the third and fourth semiconductor layers.

A ninth aspect of the present invention is directed to the semiconductor device according to any of the first to eighth aspects of the present invention, wherein a beam width of each of the ladder-shaped portions is equal to or smaller than $\frac{1}{10}$ of a beam spacing.

A tenth aspect of the present invention is directed to the semiconductor device according to any of the first to ninth aspects of the present invention, wherein an area of a surface of the second semiconductor layer which is exposed to the upper main surface is four times as large as an area of a surface of the third semiconductor layer which is exposed to the upper main surface or less.

According to the first aspect of the present invention, the third semiconductor layer is provided as a plurality of band-shaped portions parallel with each other, and furthermore, the downward protrusion having a high impurity concentration is not formed in a bottom portion of the third semiconductor layer. Therefore, there is no portion where a critical field strength is reached under a low reverse bias. Consequently, it is possible to avoid concentration of an avalanche current on a specific portion when the device is turned off under an inductive load. Moreover, the third semiconductor layer is shallower than the second semiconductor layer. Therefore, a junction resistance in a PN junction between the third semiconductor layer and a periphery thereof can be reduced sufficiently. Furthermore, the band-shaped portions forming the third semiconductor layer are coupled to each other through the fifth semiconductor layer. Therefore, it is possible to suppress such a phenomenon that remaining minority carriers concentrate on the specific portion of the third semiconductor layer in a recovery operation of a diode provided in the device. Consequently, a parasitic bipolar transistor can be prevented from being conducted.

According to the second aspect of the present invention, the fourth semiconductor layer is ladder-shaped and is connected to the first main electrode through only a crosspiece portion thereof. Therefore, even if the PN junction between the third semiconductor layer and the periphery thereof is brought into a reverse bias state so that an avalanche breakdown is caused and an avalanche current flows, the parasitic bipolar transistor is conducted with difficulty.

According to the third aspect of the present invention, the fifth semiconductor layer is formed to surround the region where the band-shaped portions are to be arranged, and couples the band-shaped portions to each other on the ends in the direction of extension of the band-shaped portions. Therefore, a corner portion having a large curvature is not provided in the band-shaped portion. Consequently, the concentration of the avalanche current is further suppressed. Thus, the parasitic bipolar transistor can be prevented more effectively from being conducted due to the avalanche current.

According to the fourth aspect of the present invention, at least one of the band-shaped portions does not include any of the ladder-shaped portions on the ends in the direction of arrangement thereof. Therefore, the parasitic bipolar transistor can be prevented more effectively from being conducted during a recovery operation.

According to the fifth aspect of the present invention, the band-shaped portion including the sixth semiconductor layer corresponding to only a part of the ladder-shaped portion is provided in a position which is the most distant from the end in the at least one band-shaped portion having no ladder-shaped portion. Therefore, the parasitic bipolar transistor can be prevented more effectively from being conducted during the recovery operation.

According to the sixth aspect of the present invention, the first main electrode is connected to the comb tooth-shaped sixth semiconductor layer through only the tooth. Therefore, even if the PN junction between the third semiconductor layer and the periphery thereof is brought into a reverse bias state so that an avalanche breakdown is caused and an avalanche current flows, the parasitic bipolar transistor is conducted with difficulty.

According to the seventh aspect of the present invention, the second semiconductor layer is selectively formed shallowly directly under the third semiconductor layer. Therefore, even if the PN junction between the third semiconductor layer and the periphery thereof is brought into a reverse bias state, the concentration of an electric field can be prevented directly under the third semiconductor layer so that a reduction in a breakdown voltage can be suppressed.

According to the eighth aspect of the present invention, the first boundary portion is set to be shorter than the second boundary portion. Therefore, even if the PN junction between the third semiconductor layer and the periphery thereof is brought into a reverse bias state so that an avalanche breakdown is caused and an avalanche current flows, the parasitic bipolar transistor can be prevented more effectively from being conducted.

According to the ninth aspect of the present invention, the beam width of each of the ladder-shaped portions is set to be $\frac{1}{10}$ of the beam spacing or less. Therefore, the parasitic bipolar transistor can be prevented more effectively from being conducted.

According to the tenth aspect of the present invention, the area of the exposed surface of the second semiconductor layer is set to be four times as large as the area of the exposed surface of the third semiconductor layer or less. Therefore, a feedback capacitance can be reduced. As a result, it is possible to reduce a switching loss caused by a switching operation of the device.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
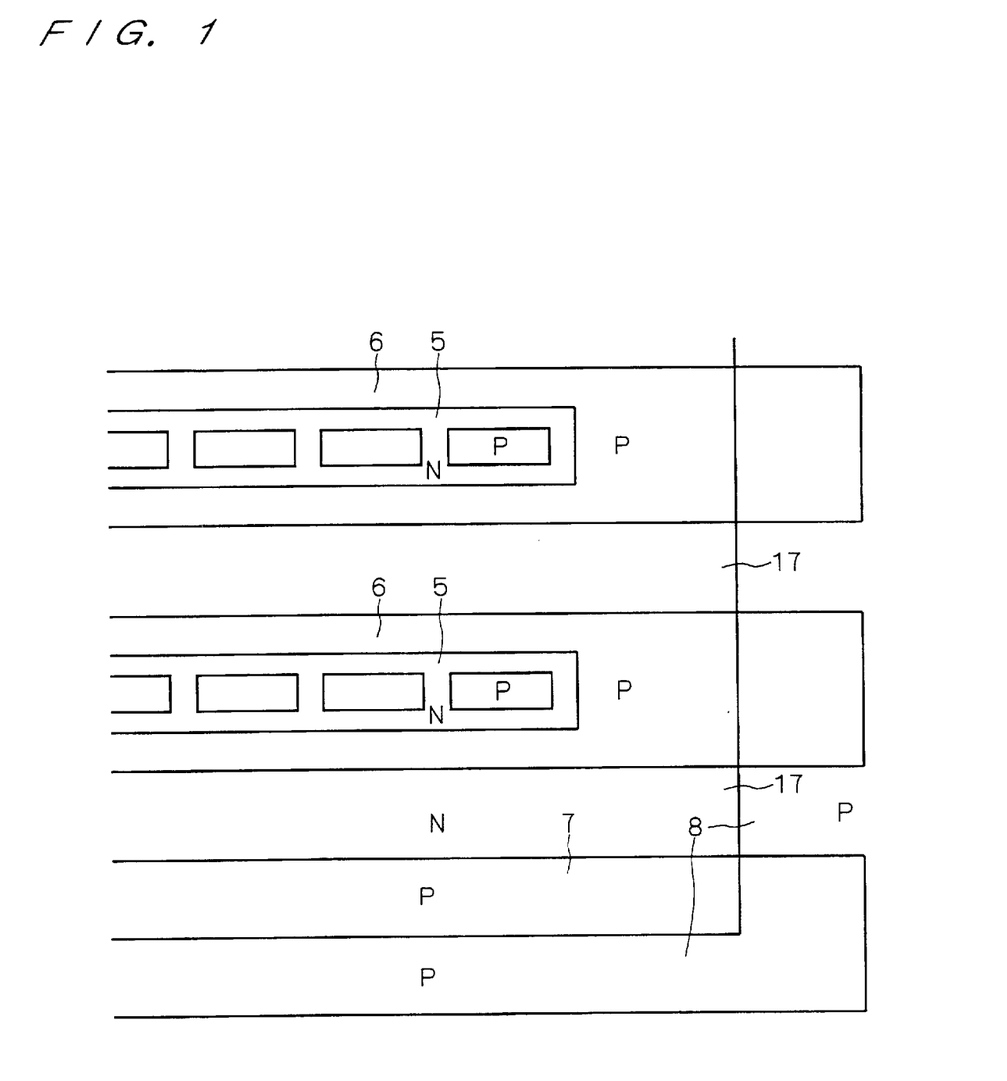
FIG. 1 is a partially enlarged plan view showing a region A of FIG. 8 according to an embodiment.

A semiconductor device according to an embodiment will be described below, considering a MOSFET as an example. A plan view showing the MOSFET is equivalent to FIG. 8. FIG. 1 is an enlarged plan view showing patterns of various semiconductor layers exposed to an upper main surface of a semiconductor substrate 1 in a region A of FIG. 8. In order to avoid redundant description, the same portions or corresponding portions (having the same functions) have the same reference numerals as those in the conventional device shown in FIGS. 8 to 10 and their detailed description will be omitted.

P base layers 6 and 7 are divided and provided as a plurality of band-shaped portions which are arranged in parallel with each other at regular intervals in the upper main surface of the semiconductor substrate 1. Therefore, a distance between the respective band-shaped portions is uniform. As a result, in the case in which a source-drain voltage is changed into a reverse bias, a depletion layer is uniformly extended from a PN junction between each of P base layers 6, 7 and 8 and an $N^-$ layer 10 toward the inside of the $N^-$ layer 10 and there is no portion where a critical field strength is reached at a comparatively low source-drain voltage. Furthermore, even if the MOSFET according to the embodiment carries out a switching operation under an inductive load and counter electromotive force is generated during turn-off so that an avalanche breakdown is caused and an avalanche current flows, the avalanche current does not intensively flow to a specific portion because there is no portion where the critical field strength is reached at a comparatively low reverse bias.

Figure 2:
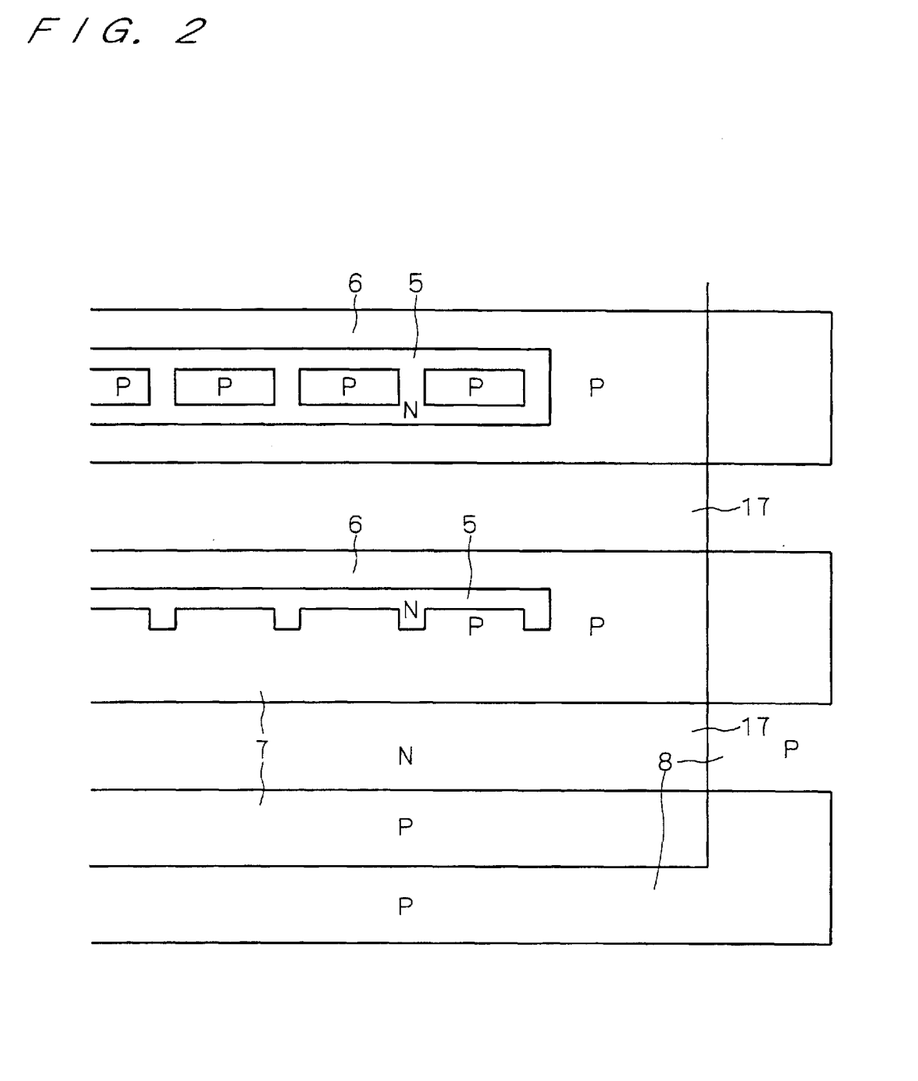
FIG. 2 is a partially enlarged plan view showing the region A of FIG. 8 in another example of a device according to the embodiment.

In place of a pattern shown in FIG. 1, a pattern shown in FIG. 2 may be employed. In both of FIGS. 1 and 2, the P base layer 7 in which an N source layer 5 is not formed is selectively provided in the vicinity of the P base layer 8. Consequently, a parasitic bipolar transistor can be prevented from being conducted during a recovery operation. FIGS. 1 and 2 are different from each other in that one band-shaped portion adjacent to the P base layer 8 is formed as the P base layer 7 in FIG. 1 and a portion corresponding to 1.5 band-shaped portions adjacent to the P base layer 8 is formed as the P base layer 7 in FIG. 2. In FIG. 2, the N source layer 5 is formed like a comb tooth corresponding to half of a ladder-shaped portion in the P base layer 7 adjacent to the P base layer 6. While an ON-state resistance is advantageously low in the pattern of FIG. 1 because of less P base layer 7, a di/dt tolerance is high and an avalanche tolerance is advantageously high in the pattern of FIG. 2 because the parasitic bipolar transistor can be prevented more effectively from being conduced.

Figure 3:
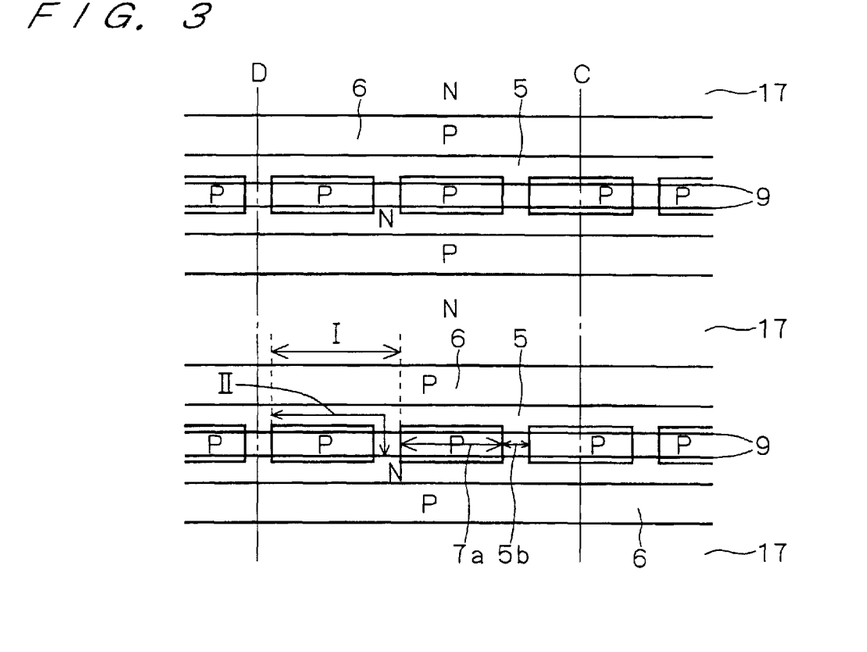
FIG. 3 is a partially enlarged plan view showing a region B of FIG. 8 according to the embodiment.
Figure 4:
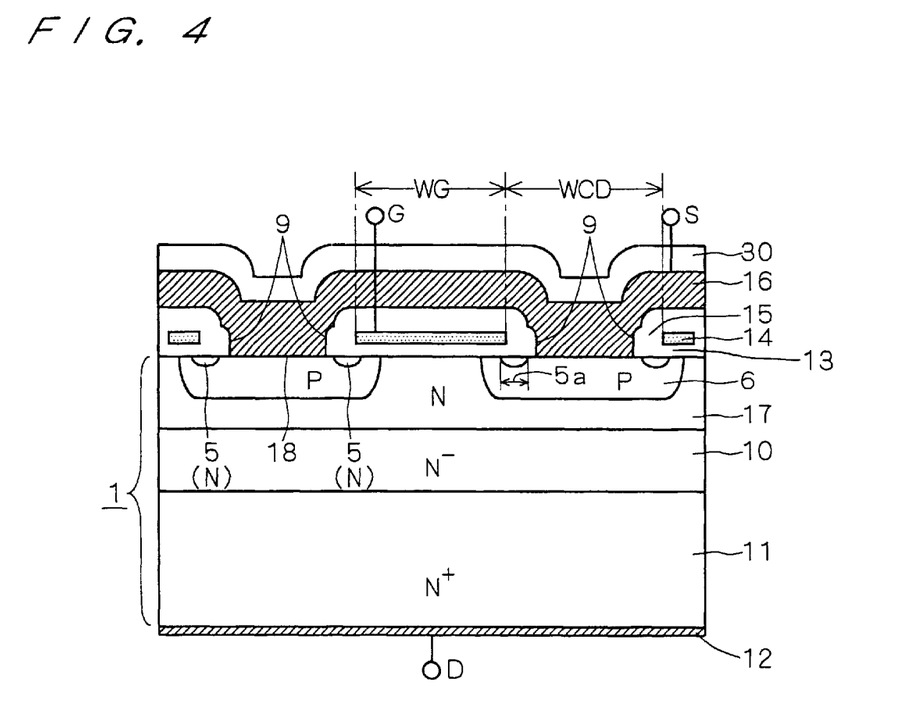
FIG. 4 is a sectional view taken along a line C—C in FIG. 3.
Figure 5:
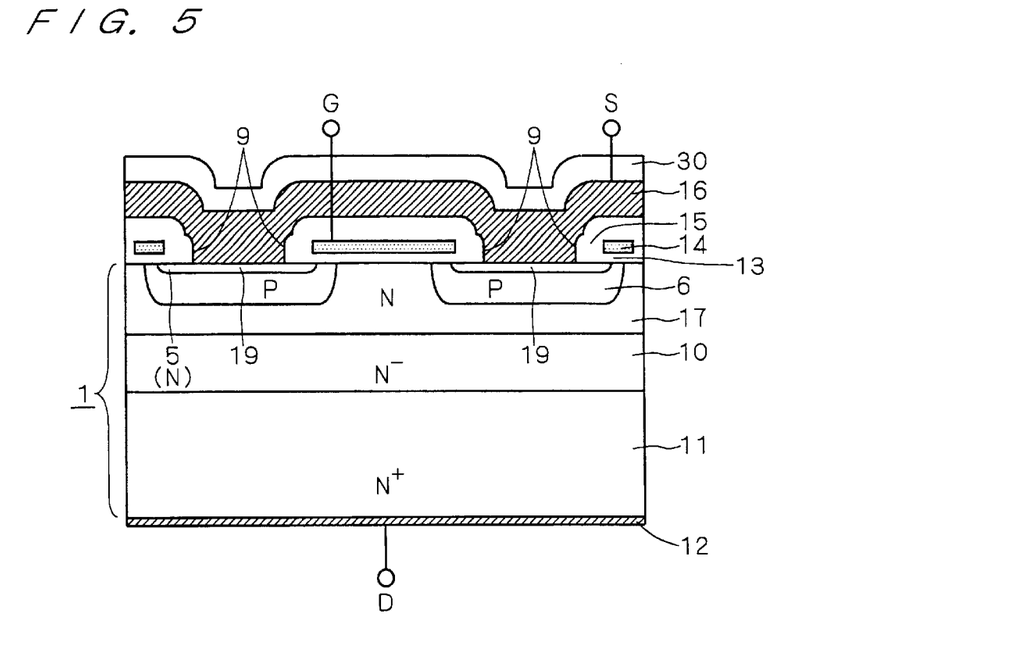
FIG. 5 is a sectional view taken along a line D—D in FIG. 3.

FIG. 3 is an enlarged plan view showing patterns of various semiconductor layers exposed to the upper main surface of the semiconductor substrate 1 in a region B of FIG. 8 for the MOSFET according to the embodiment. FIG. 4 is a sectional view taken along a cutting line C—C in FIG. 3 and FIG. 5 is a sectional view taken along a cutting line D—D in FIG. 3. As shown in FIGS. 4 and 5, a $P^+$ base layer 20 having a high impurity concentration is not formed as a protrusion provided downward in a central part of a bottom portion of the P base layer 6 in the MOSFET according to the embodiment.

Consequently, when the source-drain voltage is changed into a reverse bias, an effective distance of the depletion layer capable of being extended from the PN junction between the $P^+$ base layer 20 and the $N^-$ layer 10 toward the inside of the $N^-$ layer 10 is not shortened by the $P^+$ base layer 20 in the $N^-$ layer 10, and furthermore, there is no portion where the critical field strength is reached at a comparatively low source-drain voltage. Therefore, there is an advantage that an avalanche breakdown is caused with difficulty. In the conventional MOSFET, moreover, the $P^+$ base layer 20 is formed to serve to suppress the conduction of the parasitic bipolar transistor. In the MOSFET according to the embodiment, the P base layer 6 is divided and provided as a plurality of band-shaped portions. Therefore, convergence of an electric field can be eliminated. Consequently, even if the $P^+$ base layer 20 is removed, the conduction of the parasitic bipolar transistor can be suppressed.

As shown in FIGS. 4 and 5, moreover, an N layer 17 having a low resistance which is positioned under a gate electrode 14 is formed more deeply than the P base layer 6 in the MOSFET according to the embodiment. Therefore, a junction resistance in the PN junction between the P base layer 6 and the N⁻ layer 10 can be reduced sufficiently.

As shown in FIGS. 1 to 3, the base layers 6 and 7 are formed as the band-shaped portions isolated from each other in the MOSFET according to the embodiment. The P base layers 6 and 7 are coupled to each other through the P base region 8 on at least ends in a longitudinal direction thereof. The PN junction between each of the P base layers 6, 7 and 8 and the N⁻ layer 10 or N layer 17 corresponds to a diode provided in the MOSFET. Holes generated with the conduction of the internal diode depend on an area of each of the P base layers 6, 7 and 8 and a concentration of a P-type impurity contained therein. Therefore, the largest number of holes are generated in the vicinity of the P base layer 8. Also in the case in which the internal diode carries out a recovery operation with comparatively high di/dt, the generated holes do not intensively flow into the specific isolated P base layer 6 because the isolated P base layer 6 is not provided in the vicinity of the P base layer 8. Accordingly, it is possible to prevent such a phenomenon that a parasitic bipolar transistor formed by the N⁻ layer 10 or N layer 17, the P base layer 6 and the N source layer 5 is conducted.

As shown in FIGS. 3 to 5, the N source layer 5 selectively formed in the upper main surface of the semiconductor substrate 1 is provided with one to one correspondence within the P base layer 6 and is divided and arranged as a plurality of ladder-shaped portions having ladder-like planar shapes in parallel with each other in the MOSFET according to the embodiment. A portion adjacent to the outside of the ladder-shaped portion formed in the exposed surface of each band-shaped portion of the P base layer 6 corresponds to a channel region. The gate electrode 14 is opposed to a region interposed between the ladder-shaped portions adjacent to each other in the upper main surface of the semiconductor substrate 1 with a gate insulating film 13 provided therebetween.

An opening 9 formed on an insulating layer 15 is band-shaped extending along a longitudinal direction of each ladder-shaped portion, and furthermore, is provided apart from the channel region. Accordingly, the N source layer 5 is connected to a source electrode 16 through only a contact portion 19 positioned in an exposed surface of a crosspiece portion (which is also referred to as a beam, rung or step portion) of the ladder-shaped portion. Moreover, the P base layer 6 is connected to the source electrode 16 through only a contact portion 18 positioned in a rectangular exposed surface surrounded by strut (i.e., side rail) portions and the crosspiece portions in each ladder-shaped portion.

Therefore, a width 5a of the N source layer 5 (FIG. 4) can be set smaller than a width 5a in the conventional MOSFET (FIG. 10). Consequently, a resistance is reduced in the P base layer 6 portion provided under the N source layer 5. Therefore, even if the PN junction between the P base layer 6 and the N layer 17 or N⁻ layer 10 is brought into a reverse bias state so that an avalanche breakdown is caused and an avalanche current flows, the parasitic bipolar transistor is conducted with more difficulty than the conventional MOSFET.

As shown in FIG. 3, in the MOSFET according to the embodiment, a boundary exposed to the upper main surface of the semiconductor substrate 1 between the source layer 5 and the P base layer 6 includes a first boundary portion I and a second boundary portion II. The first boundary portion is a portion provided along the outside of each ladder-shaped portion, i.e., a portion forming a boundary with the channel region. The second boundary portion II is a portion provided along the inside of each ladder-shaped portion, i.e., a portion forming a boundary with the rectangular exposed surface portion of the P base layer 6 surrounded by the strut portions and the crosspiece portions in each ladder-shaped portion. Lengths of the first and second boundary portions I and II can be compared with each other by using a representative length determined as a length within a pattern repetition unit as shown in FIG. 3.

In the MOSFET according to the embodiment, preferably, the second boundary portion II is set to be longer than the first boundary portion I. Consequently, the width 5a of the N source layer 5 is reduced. In addition, a length (i.e., a width of the crosspiece portion ; a beam width) 5b of the N source layer 5 is limited to be much smaller than a length (i.e., a spacing between the adjacent crosspiece portions ; a beam spacing) 7a of the exposed surface of the P base layer 6 in a direction of extension of the opening 9. As a result, even if the PN junction between the P base layer 6 and the N layer 17 or N⁻ layer 10 is brought into a reverse bias state so that the avalanche breakdown is caused and the avalanche current flows, the parasitic bipolar transistor formed by the N⁻ layer 10 or N layer 17, the P base layer 6 and the N source layer 5 is conducted with difficulty.

More preferably, the beam width 5b is set to be equal to or smaller than one-tenth of the beam spacing 7a. Consequently, the parasitic bipolar transistor is conducted with more difficulty.

Figure 6:
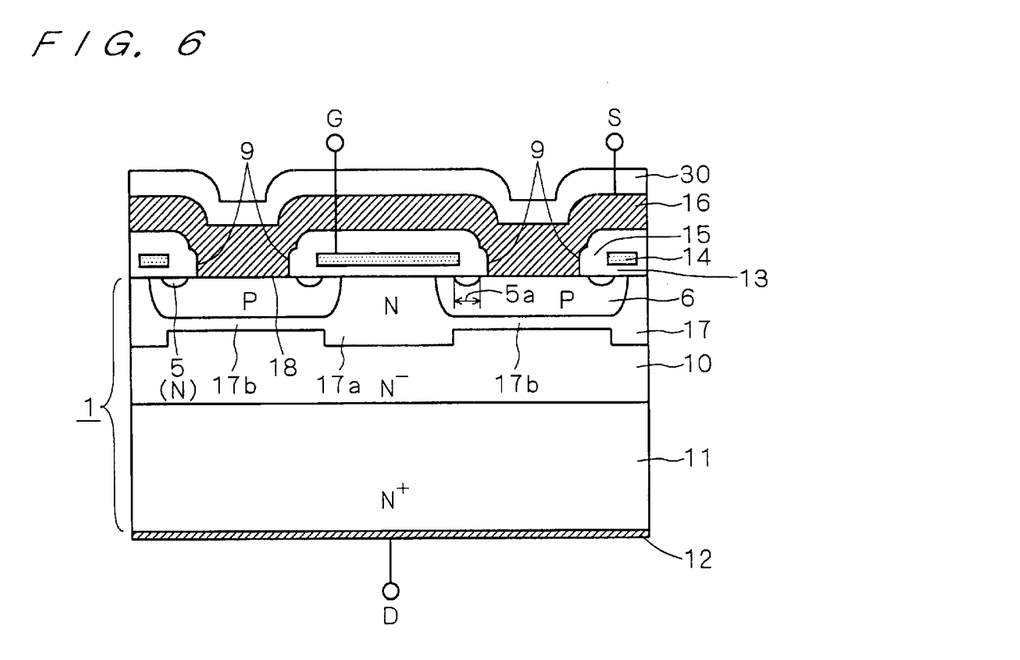
FIG. 6 is a sectional view showing a further example of the device according to the embodiment.

More preferably, the N layer 17 is selectively formed shallowly directly under the P base layer 6 as shown in FIG. 6 illustrating another example of the sectional view taken along the cutting line C—C in FIG. 3. A region provided under the P base layer 6 is not a current path. Moreover, also in the case in which the PN junction between the P base layer 6 and the N⁻ layer 10 or N layer 17 is brought into the reverse bias state, the concentration of an electric field is suppressed under the P base layer 6 so that a breakdown voltage can be prevented from being reduced.

Figure 7:
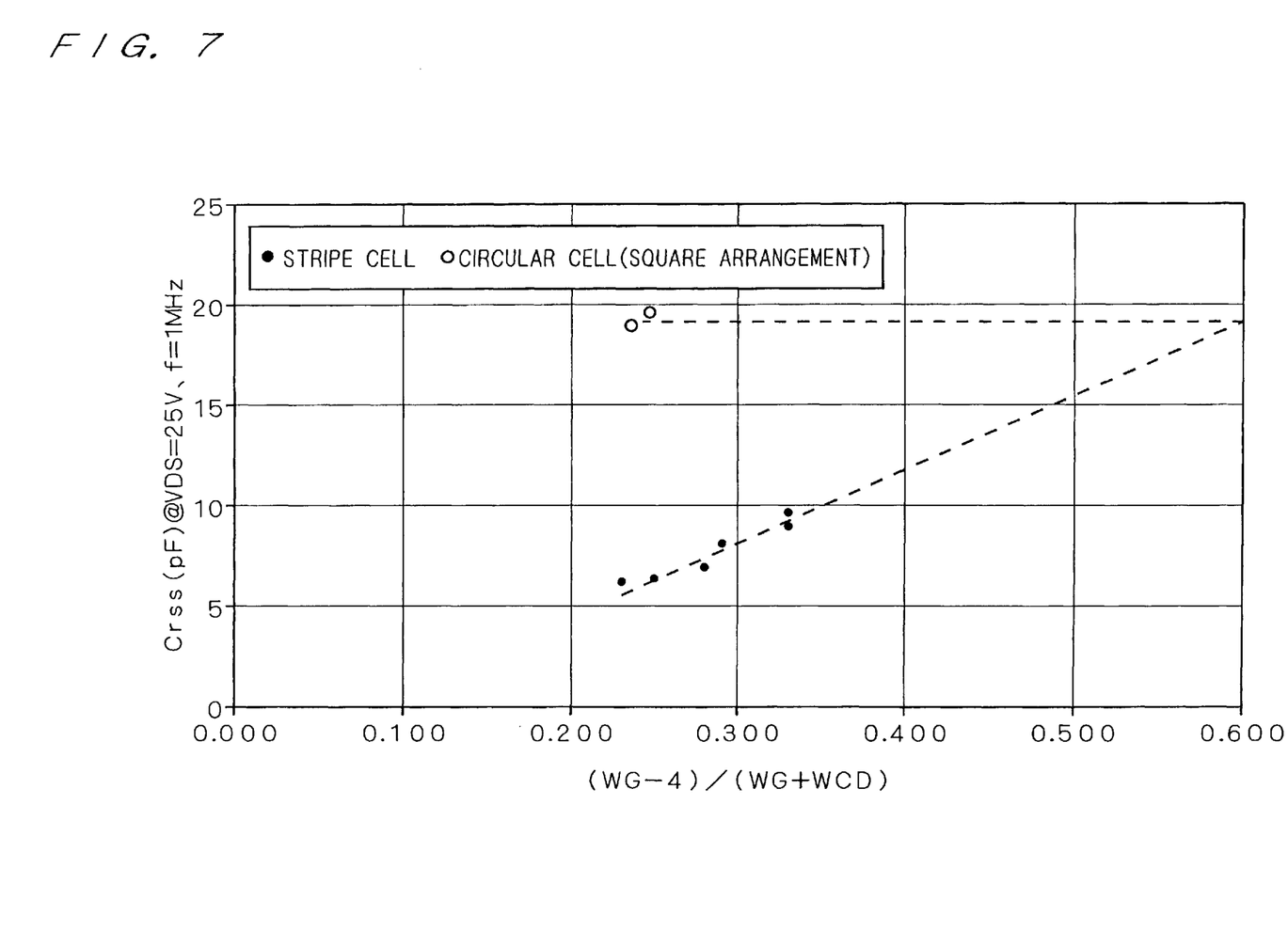
FIG. 7 is a graph showing proven data of the device according to the embodiment.

More preferably, the area of the exposed surface of the N layer 17 opposed to the gate electrode 14 is controlled to be four times as large as the area of the exposed surface of the P base layer 6 or less. Consequently, a feedback capacitance is reduced. As a result, a switching loss caused by a switching operation can be reduced. FIG. 7 shows proven data based on the foregoing. In a graph of FIG. 7, an axis of abscissa represents a function (WG −4 μm)/(WG+WCD) expressed by a gate width WG and a gate spacing WCD in FIG. 4 and an axis of ordinate represents a feedback capacitance Crss with a source-drain voltage of 25 V and an operating frequency of 1 MHz. Data on the conventional MOSFET (the planar shape of the P base layer 6 is not a square but a circle and has no substantial difference) are represented by a white circle and data on the MOSFET according to the embodiment are represented by a black circle.

As shown in FIG. 7, when a function value is 0.6, the feedback capacitance of the MOSFET according to the embodiment is coincident with that of the conventional MOSFET. This implies the following. When the gate spacing WCD is 4 μm and the gate width WG is 16 μm, that is, a ratio of the areas is four times larger, the feedback capacitances Crss between the two MOSFETs are coincident with each other. Furthermore, if the ratio of the areas is four times or less, the feedback capacitance Crss of the MOSFET according to the embodiment is smaller than that of the conventional MOSFET.

While the example in which the semiconductor device is an N-channel MOSFET has been taken in the above description, the present invention can also be executed for a P-channel MOSFET having a conductivity type inverted. Furthermore, the present invention can also be applied to an N-channel IGBT in which a P-type semiconductor layer is provided between the N$^+$ layer 11 and a lower main surface of the semiconductor substrate 1 as well as the N-channel MOSFET in which the N$^+$ layer 11 is exposed to the lower main surface of the semiconductor substrate 1. Furthermore, the present invention can also be applied to a P-channel IGBT having a conductivity type obtained by inverting the conductivity type of the N-channel IGBT. Moreover, the present invention can be applied to a general vertical type insulated gate semiconductor device having a MOS structure on the upper main surface of the semiconductor substrate 1 as well as the MOSFET and the IGBT.

Moreover, while the example in which the N source layer 5 is provided in all the P base layers 6 has been described, it is also possible to generally execute the present invention in such a configuration that the N source layer 5 is not provided in a part of the P base layers 6 arranged on the inside as well as the P base layer 7 positioned on the end.

Furthermore, although a silicon substrate is typically used for the semiconductor substrate 1, the present invention can also be executed for a semiconductor substrate using other semiconductor materials.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising a semiconductor substrate having an upper main surface and a lower main surface, said semiconductor substrate including:
    a first semiconductor layer of a first conductivity type;
    a second semiconductor layer of the first conductivity type which is formed on said first semiconductor layer to be exposed to said upper main surface and has a higher impurity concentration than said first semiconductor layer;
    a third semiconductor layer of a second conductivity type which is selectively formed in said upper main surface more shallowly than said second semiconductor layer, is divided into and provided as a plurality of band-shaped portions parallel with each other, and is not provided with a downward protrusion having a higher impurity concentration in a bottom portion than a periphery;
    a fourth semiconductor layer of the first conductivity type which is selectively formed in said upper main surface and is divided into and provided as a plurality of ladder-shaped portions parallel with each other, each of said ladder-shaped portions being formed to be extended more shallowly in and along any of at least a part of said band-shaped portions individually corresponding thereto; and
    a fifth semiconductor layer of the second conductivity type which is selectively formed in said upper main surface and couples said band-shaped portions to each other,
said semiconductor device further comprising:
    an insulating film formed on a region interposed between adjacent sets of said ladder-shaped portions in said upper main surface;
    a gate electrode formed on said insulating film and opposed to said region;
    a first main electrode connected to each of said band-shaped portions and connected to each of said ladder-shaped portions through at least a crosspiece portion thereof; and
    a second main electrode connected to said lower main surface.

2. The semiconductor device according to claim 1, wherein said first main electrode is connected to each of said ladder-shaped portions through only said crosspiece portion thereof.

3. The semiconductor device according to claim 1, wherein said fifth semiconductor layer is formed to surround a region where said band-shaped portions are arranged, and couples said band-shaped portions to each other on ends in a direction of extension of said band-shaped portions.

4. The semiconductor device according to claim 1, wherein at least one of said band-shaped portions does not include any of said ladder-shaped portions on ends in a direction of arrangement thereof.

5. The semiconductor device according to claim 4, further comprising a sixth semiconductor layer of the first conductivity type which is selectively formed like a comb tooth in said upper main surface and is extended more shallowly within and along one of said at least one band-shaped portion provided most apart from said end in said direction of arrangement of said at least one band-shaped portion such that said comb tooth faces to said end side,
    said insulating film being also formed on an end region which is a region interposed between said sixth semiconductor layer and one of said ladder-shaped portions adjacent thereto in said upper main surface,
    said gate electrode being also formed on a portion of said insulating film provided on said end region and being thereby opposed to said end region, and
    said first main electrode being also connected to said sixth semiconductor layer through at least said tooth.

6. The semiconductor device according to claim 5, wherein said first main electrode is connected to said sixth semiconductor layer through only said tooth.

7. The semiconductor device according to claim 1, wherein said second semiconductor layer is selectively formed shallowly directly under said third semiconductor layer.

8. The semiconductor device according to claim 1, wherein a first boundary portion provided along an outside of each of said ladder-shaped portions is shorter than a second boundary portion provided along an inside in a boundary exposed to said upper main surface between said third and fourth semiconductor layers.

9. The semiconductor device according to claim 1, wherein a beam width of each of said ladder-shaped portions is equal to or smaller than $\frac{1}{10}$ of a beam spacing.

10. The semiconductor device according to claim 1, wherein an area of a surface of said second semiconductor layer which is exposed to said upper main surface is four times or less as large as an area of a surface of said third semiconductor layer which is exposed to said upper main surface.

11. The semiconductor device according to claim 1, wherein said semiconductor substrate further includes a seventh semiconductor layer of the first conductivity type formed so as to interpose said first semiconductor layer with said second semiconductor layer, and having higher impurity concentration than said first semiconductor layer.

12. The semiconductor device according to claim 1, wherein said semiconductor substrate further includes an eighth semiconductor layer of the second conductivity type exposed to said lower main surface.

* * * * *